(12) United States Patent
Divakaruni et al.

(10) Patent No.: US 6,444,548 B2
(45) Date of Patent: *Sep. 3, 2002

(54) BITLINE DIFFUSION WITH HALO FOR IMPROVED ARRAY THRESHOLD VOLTAGE CONTROL

(75) Inventors: Ramachandra Divakaruni, Middletown; Yujun Li, Poughkeepsie; Jack A. Mandelman, Stormville, all of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/257,817

(22) Filed: Feb. 25, 1999

(51) Int. Cl.$^7$ .................. H01L 21/8242; H01L 21/336; H01L 21/425; H01L 21/22; H01L 21/38; H01L 27/108; H01L 29/76; H01L 29/94; H01L 31/119

(52) U.S. Cl. ................... 438/525; 438/243; 438/302; 438/306; 438/527; 438/555; 257/301

(58) Field of Search ................................ 438/302, 306, 438/525, 527, 555, 243; 257/301

(56) References Cited

U.S. PATENT DOCUMENTS 5,112,762 A * 5/1992 Anderson et al.
5,312,768 A * 5/1994 Gonzalez ................. 437/40
5,387,534 A * 2/1995 Prall ........................ 437/52
5,439,835 A * 8/1995 Gonzalez ................. 437/35

FOREIGN PATENT DOCUMENTS

JP 404094570 A * 3/1992 .......... H01I/27/112

* cited by examiner

Primary Examiner—Tuan H. Nguyen
Assistant Examiner—Nema Berezny
(74) Attorney, Agent, or Firm—McGinn & Gibb; Todd M. C. Li

(57) ABSTRACT

A integrated circuit device and method for manufacturing an integrated circuit device includes forming a patterned gate stack, adjacent a storage device, to include a storage node diffusion region adjacent the storage device and a bitline contact diffusion region opposite the storage node diffusion region, implanting an impurity in the storage node diffusion region and the bitline contact diffusion region, forming an insulator layer over the patterned gate stack, removing a portion of the insulator layer from the bitline contact diffusion region to form sidewall spacers along a portion of the patterned gate stack adjacent the bitline contact diffusion region, implanting a halo implant into the bitline contact diffusion region, wherein the insulator layer is free from blocking the halo implant from the second diffusion region and annealing the integrated circuit device to drive the halo implant ahead of the impurity.

29 Claims, 5 Drawing Sheets

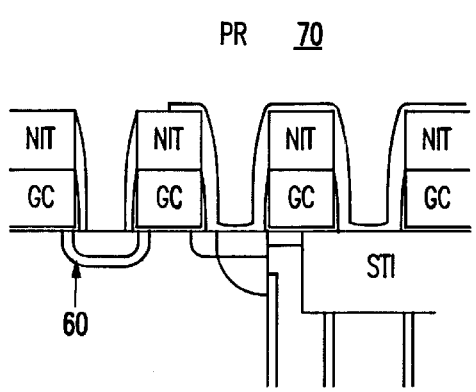
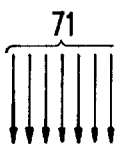
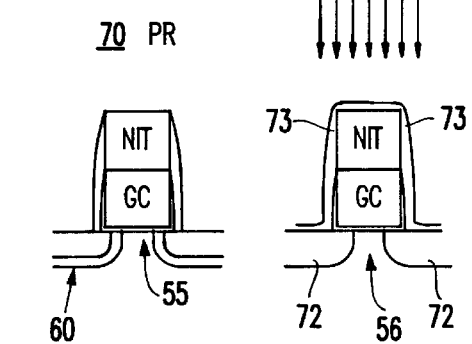
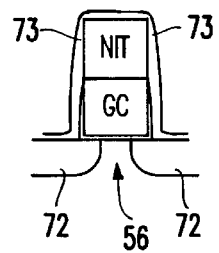
FIG.7A     FIG.7B     FIG.7C
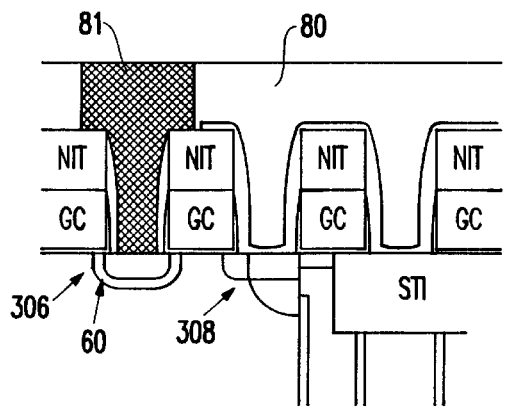
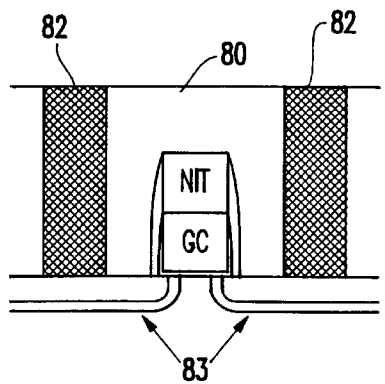
FIG.8A     FIG.8B

BITLINE DIFFUSION WITH HALO FOR IMPROVED ARRAY THRESHOLD VOLTAGE CONTROL

BACKGROUND OF THE INVENTION

1. Field of the Invention

The present invention generally relates to integrated circuits and more particularly to controlling the threshold voltage of semiconductor devices using halo structures.

2. Description of the Related Art

Conventional integrated circuit device structures are continuously being reduced in size to increase processing speed and decrease manufacturing cost. Conventional methods of reducing the size of such devices shrink all the dimensions of the device proportionally.

However, as the channel length in the metal oxide semiconductor field effect transistors (MOSFETs) is reduced to increase speed, a "short-channel" effect often occurs which severely degrades the device characteristics. More specifically, the short channel effect is an undesirable decrease in the threshold voltage of the gate as the channel length is reduced. Additionally, the scalability of the planar MOSFET in this environment is severely limited by reliability imposed constraints on minimum gate insulator thickness and poor physical attributes such as excessive buried strap outdiffusion, for trench storage DRAMS active area (AA) and gate conductor (GC) critical dimension control, gate conductor-deep trench (GC-DT) overlay tolerance, shallow trench isolation (STI) recess and geometry control.

One specific manifestation of the scalability difficulties of planar dynamic random access memory (DRAM) MOSFETs is degradation of the retention time tail, due to increased junction leakage resulting from the very high channel doping concentrations which are required to suppress the short-channel effects.

Therefore, there is a conventional need for a method and structure which overcomes these scalability problems to produce more consistent threshold voltages.

SUMMARY OF THE INVENTION

It is, therefore, an object of the present invention to provide a structure and method for manufacturing an integrated circuit device including forming a transistor, adjacent a storage device, to include a storage node diffuision region adjacent the storage device and a bitline contact diffusion region opposite the storage node diffusion region, implanting an impurity in the storage node diffusion region and the bitline contact diffusion region, forming an insulator layer over the transistor, patterning a mask over the transistor to expose the bitline contact diffusion region, removing a portion of the insulator layer from the bitline contact diffusion region to form sidewall spacers along a portion of the transistor adjacent the bitline contact diffusion region, removing the mask, implanting a halo implant into the bitline contact diffusion region, wherein the insulator layer is free from blocking the halo implant from the second diffusion region and annealing the structure to drive the halo implant ahead of the impurity.

The implanting of the impurity includes patterning a first mask over the transistor to expose the storage node diffusion region, implanting the impurity into the storage node diffusion region using a first doping concentration, removing the first mask, patterning a second mask over the transistor to expose the bitline contact diffusion region, implanting the impurity into the bitline contact diffusion region using a second doping concentration, wherein the second doping concentration is higher than the first doping concentration and removing the second mask. The second doping concentration is approximately 10 times the first doping concentration.

The implanting may be an angled ion implantation and a geometry of the transistor, the insulator layer and the bitline contact diffusion region allows ions applied at an angle up to approximately 30° to the normal of a surface of the bitline contact diffusion region to reach the bitline diffusion region.

The method may also include forming support devices, wherein the implanting of the impurity includes implanting the impurity into source and drain regions of the support devices, and wherein the implanting of the halo implant includes implanting selected ones of the support devices with the halo implant. The invention also forms a patterned insulator layer over the transistor and the support devices (the patterned insulator layer including bitline contact openings, support source openings and support drain openings) and simultaneously deposits a conductor in the bitline contact openings, the support source openings and the support drain openings, wherein the conductor may be tungsten.

The invention forms a P-type halo which surrounds the N+ bitline diffusion region. Since the threshold voltage and short-channel effects of the array MOSFET are dominated by the halo, the normally implanted channel doping concentration may be greatly reduced, which allows the invention to achieve improved array threshold voltage (VT) control without increased node diffusion leakage. Furthermore, the invention allows the use of tungsten studs, which are normally only used in the supports, to be used in the array, as well.

BRIEF DESCRIPTION OF THE DRAWINGS

The foregoing and other objects, aspects and advantages will be better understood from the following detailed description of preferred embodiments of the invention with reference to the drawings, in which:

FIGS. 7A–7C are schematic diagrams showing a cross-sectional view of a stage of development of a semiconductor device;

FIGS. 8A–8B are schematic diagrams showing a cross-sectional view of a stage of development of a semiconductor device.

DETAILED DESCRIPTION OF PREFERRED EMBODIMENTS OF THE INVENTION

Figure 1:
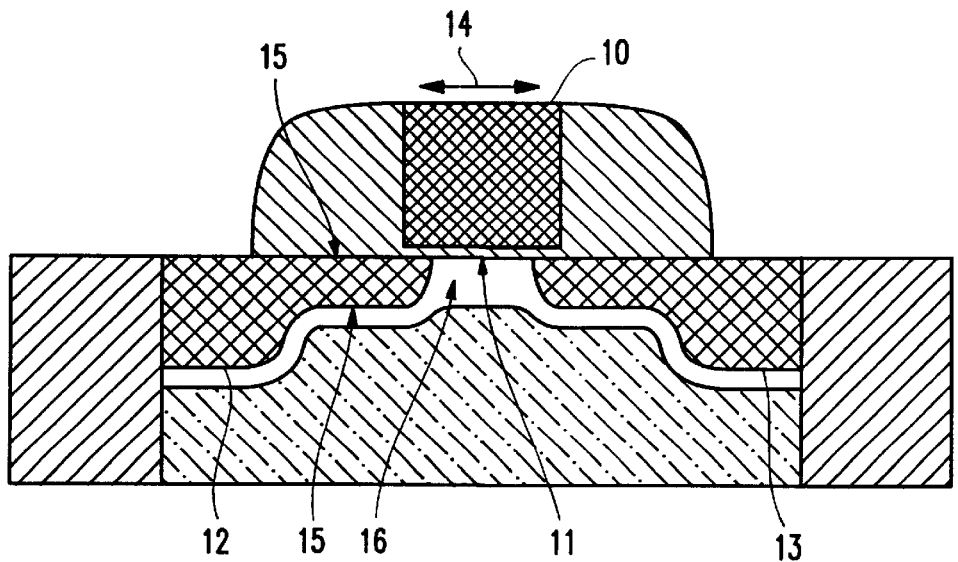
FIG. 1 is a schematic diagram of a cross-sectional view of a semiconductor device.

Referring now to the drawings, and more particularly to FIG. 1, a MOSFET device having a gate 10, gate oxide layer 11, source region 12 and drain region 13 is illustrated. When reducing the size of the MOSFET, the dimension of the oxide thickness 11 and the junction depth 15 can preferably be decreased and the depletion region 16 can preferably be effectively reduced by increasing the substrate doping.

Figure 2:
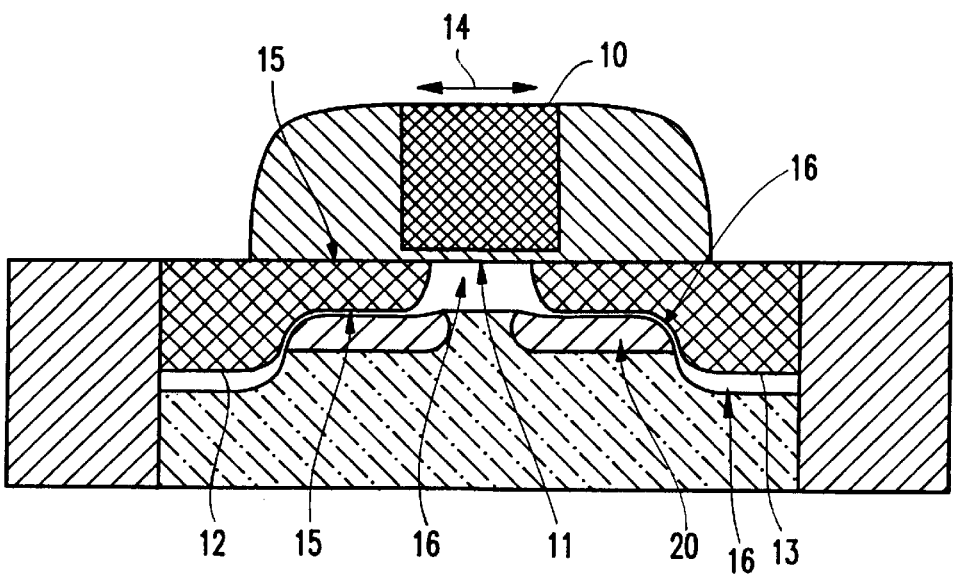
FIG. 2 is a schematic diagram of a cross-sectional view of a semiconductor device.

When the channel length 14 is reduced, a "halo implant" 20, as shown in FIG. 2, is preferably used to control the short channel effect. As mentioned above, the short channel effect is an undesirable decrease in the threshold voltage of the gate 10 as the channel length 14 is reduced. The halo implant 20 is a ring-shaped structure which is positioned between the source 12 and drain 13 and below the oxide layer 11.

The halo implant 20 reduces the short channel effect by surrounding the source-drain 12, 13 extensions to prevent electrical field line penetration. The halo implant 20 introduces a lateral nonuniformity, which is essential for controlling the short-channel effect.

Figure 3:
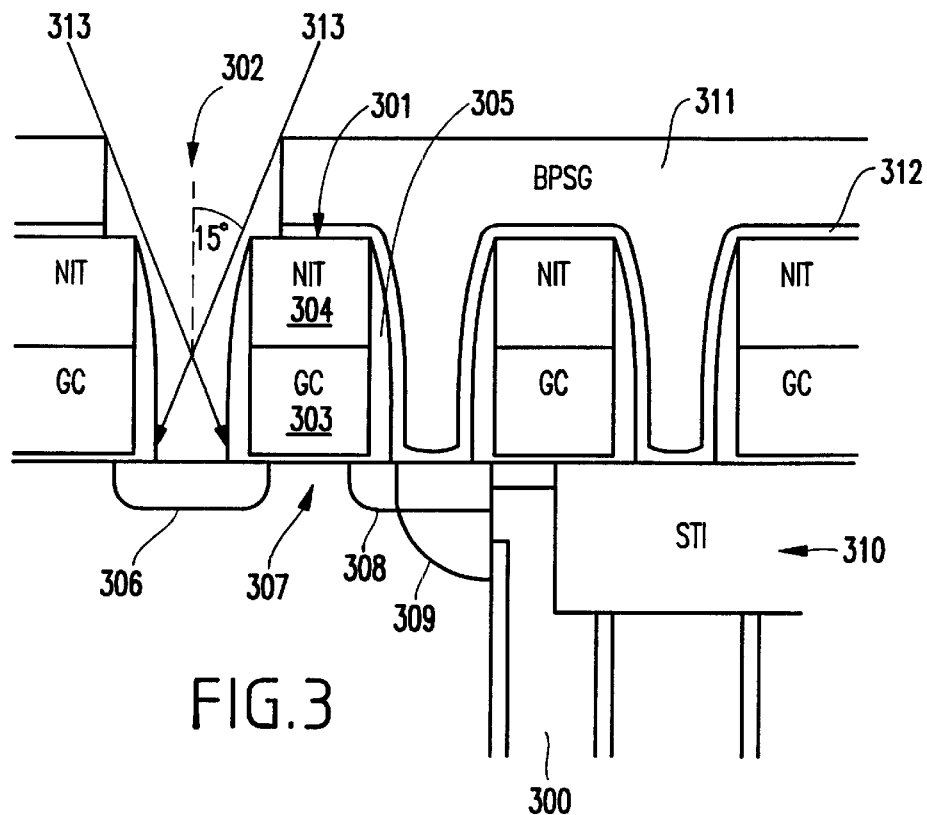
FIG. 3 is a schematic diagram showing a cross-sectional view of a stage of development of a semiconductor device.

As shown in FIG. 3, halos are also useful in bitline contact depletion regions of deep trench dynamic random access memory cells. More specifically, FIG. 3 illustrates a deep trench (DT) capacitor 300, a transistor 301 controlling access to the deep trench capacitor 300, and an opening 302 in which a bitline contact (CB) will be formed. The transistor 301 includes a gate conductor (GC) and a nitride cap (NIT) 304 which are bordered by insulating spacers 305. The structure also includes a bitline contact diffusion region 306, a well region 307, a storage node diffusion region 308 and a conductive strap 309 connecting the deep trench capacitor 300 to the storage node diffusion region 308 of the transistor 301. A shallow trench isolation region 310 isolates transistors outside the active area. The entire structure is covered with an insulator such as boron phosphorous silicate glass (BPSG) 311 which includes an underlying insulator layer 312.

The processes and materials used to form such a deep trench capacitor/transistor structure are well known to those ordinarily skilled in the art and will not be discussed in detail. Briefly, such processes include various deposition, masking, and etching techniques which deposit and remove portions of different layers to produce the structures illustrated in FIG. 3.

In order to achieve a halo implant around the bitline contact diffusion region 306, an angled implant 313 is used to allow the implanted material to travel as far under the gate conductor 303 as possible to increase the area of the halo implant around the diffusion region. In the example shown in FIG. 3, the angled implantation of a P-type species (e.g., boron, indium, etc.) could be made into the bitline contact (CB) opening 302 in the array to form a halo surrounding the bitline diffusion. The halo implant diffuses at a faster rate than the bitline diffusion implant (e.g., N+ type species, preferably arsenic, etc.) when annealed. Therefore, if the halo implant can be deposited as far as possible under the gate conductor 303, during the annealing process the halo implant species will diffuse ahead of the bitline diffusion region species and form a halo that surrounds the diffusion region 306. To the contrary, if the halo implant does not reach sufficiently under the gate conductor 303, it will not diffuse into the well region 307 sufficiently to provide the needed control of the threshold voltage.

The difficulty with using an angled implant with the inventive structure shown in FIG. 3 is that shadowing from the transistor/BPSG structure 311 which limits the implant to very steep angles (e.g., typically less than 15°). The steep implantation angle prevents the implanted species from sufficiently diffusing ahead of the bitline diffusion 306 material.

Figures 6A, 6B, 6C:
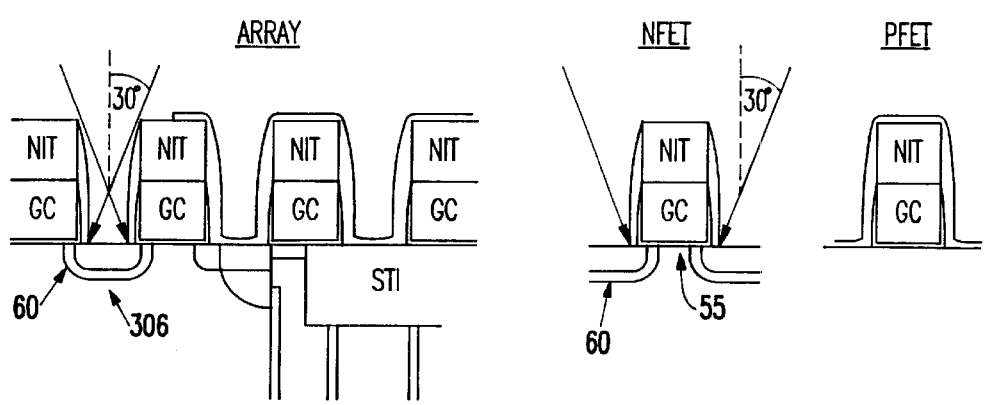
FIGS. 6A–6C are schematic diagrams showing a cross-sectional view of a stage of development of a semiconductor device.

One aspect of the invention performs the angled implantation of the halo species before the insulating layer 311 is formed (as shown in FIG. 6A). This allows the implant angle to be substantially increased (e.g. 30°). Therefore, with the invention, a stronger halo is formed beneath the bitline contact diffusion region 306 of the transistor 301.

Another aspect of the invention forms the implant in the bitline contact diffusion region 306 separately from the storage node diffusion region 308 to allow a heavier doping in the bitline contact diffusion region 306. The heavier doping of the bitline contact diffusion region 306 allows alternative contact materials, (instead of polysilicon) such as tungsten, to be used in the bitline contact opening, without risking excess junction leakage from the bitline diffusion region 306. A higher concentration N+ dopant in the bitline diffusion allows the use of metal contact studs (i.e., tungsten) without punching through to the P-well. Further, by allowing a lighter doping within the node diffusion region 308, the amount of diffusion leakage is reduced in that region, which improves data retention time. Furthermore, the inventive process allows diffusion contacts which are borderless (e.g., self-aligned) to the gate conductor, to be used in the supports as well as in the array.

Figure 4:
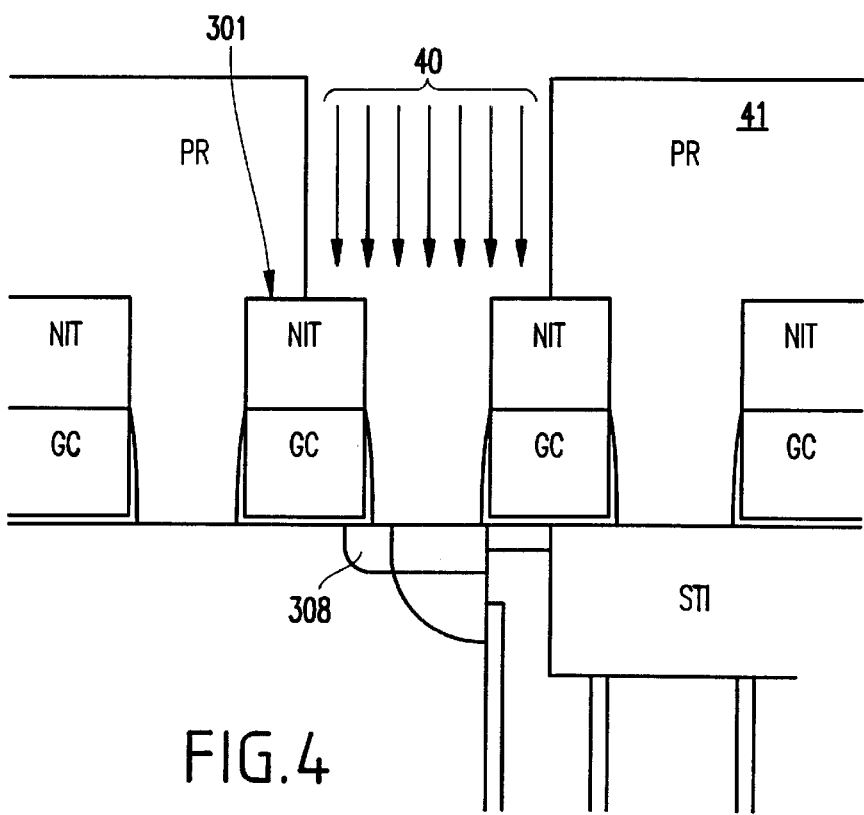
FIG. 4 is a schematic diagram showing a cross-sectional view of a stage of development of a semiconductor device.

FIG. 4 illustrates the structure shown in FIG. 3 before the formation of the insulating layers 311, 312, similar items are given similar reference numbers. Thus, the gate stack has been patterned and a gate conductor sidewall oxide has been grown.

A resist 41 is formed over the structure and patterned (using conventional well known techniques) to expose the areas above the storage node diffusion region 308. A light doping implant 40 is made into the opening to dope the storage node diffusion region 308. For example, the transistor 301 may comprise an N-type field effect transistor (NFET) and the doping of the storage node diffusion region 301 could be performed with an N+ type material. The light doping implant could comprise, for example, a phosphorous dose between $2 \times 10^{13}$ cm$^{-2}$ and $1 \times 10^{14}$ cm$^{-2}$ at an energy between 5 and 25 kev. Alternatively, arsenic may be implanted. A storage node diffusion surface concentration of approximately $5 \times 10^{18}$ cm$^{-3}$–$5 \times 10^{19}$ cm$^{-3}$ is desired.

Optionally, the photo-resist 41 may be opened over the support NFETs prior to the storage node implant to provide more lightly doped source-drain extensions in the support NFETs for hot-electron immunity. If a light dose arsenic implant is used for the storage node doping, the bitline contact area may be left uncovered by the photo-resist. The bitline contact will receive the node implant and will also subsequently receive the higher dose N+ implant which is masked from the node. Only the support PMQSFETs are masked during this modified node implant step. This simplifies the masking requirements, since now only a non-critical block mask is needed over the PMOSFETs. Note that this option may only be used if arsenic is used for the node implant, since phosphorous would cover up the subsequent boron halo.

Figures 5A, 5B, 5C:
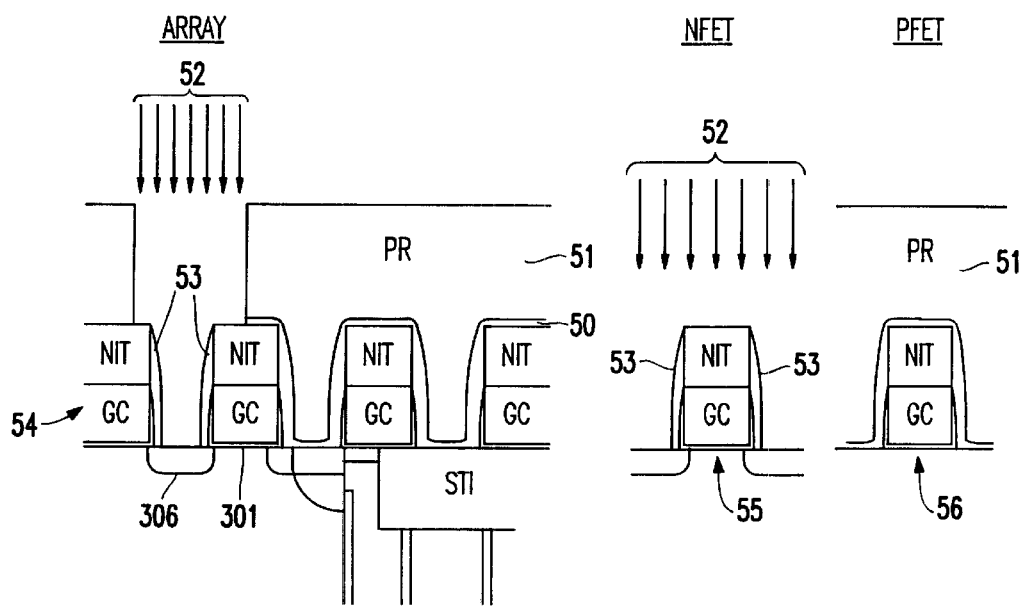
FIGS. 5A–5C are schematic diagrams showing a cross-sectional view of a stage of development of a semiconductor device.

The photoresist 41 is stripped and, as shown in FIG. 5A, a thin (i.e. 20 nm) nitride barrier 50 is deposited. A second photoresist mask 51 is deposited and patterned to expose the bitline diffusion region 306. As shown in FIGS. 5B and 5C the N-type support field effect transistors (NFET) are exposed by the photoresist 51 and the P-type support field effect transistors (PFET) are protected by the photoresist 51.

The nitride barrier 50 not protected by the photoresist 51 is etched in, for example, a reactive ion etching (RIE) process. The etching process is selected to remove material from horizontal surfaces at a much faster rate than it removes material from vertical surfaces. Therefore, the etching process allows nitride spacers 53 to remain on the side walls of the gate conductor stacks 301, 54 adjacent the bitline diffusion region 306 and on the NFET support devices 55. Optionally, an isotropic chemical deposition etch (CDE) may be used to completely remove the nitride liner from the bitline diffusion region. This allows an even more effective penetration of the subsequent boron halo under the edge of the gate. Then, nitride spacers are formed on the gate conductor edges.

A shallow N+ type implant 52 (e.g., preferably As, since it is a slow diffuser) is made into the openings in the photoresist pattern 51. This implant is substantially heavier than the first implant made to the storage node diffusion region 308. For example, the heavier implant is as much as 10 times heavier than the previous light implant and could provide a surface doping concentration in the range of $1\times10^{19}$ to $1\times10^{21}$ cm$^{-3}$ and is preferably $1\times10^{20}$ cm$^{-3}$. This provides a shallow bitline diffusion 306 in the array and shallow source/drain (S/D) diffusions in the NFET supports.

Alternatively, as would be well known by one ordinarily skilled in the art given this disclosure, plasma immersion doping or gas phase doping may be used to implant the N+ type implant. Since these techniques are less directional than ion implantation, any active area (AA) sidewall exposed during the etching of the nitride barrier 50 will also become N+ doped. This active area doping will protect against diffusion to P-well shorts, and allow metal contacts, such as tungsten studs, to be used in the array. Further, the residual nitride 50 remaining on the active area sidewalls after the etching will also provide protection against diffusion to P-well shorts, thus allowing the NFET 55 source/drain diffusion regions and the bitline contact diffusion regions 306 to be formed by standard ion implantation.

At this point, a P-type halo doping maybe introduced by using an ion implantation into the areas not protected by the resist 51. The ion implantation also forms halos in the support NFETs for short-channel effect control. The resist 51 is then stripped. More specifically, the halo doping could comprise any well known P-type dopant, preferably a low energy boron implant made into the silicon not protected by the nitride liner. Further, the energy level of the implant is selected to allow the sufficient lateral straggle to form a halo. For example, if boron is used as an impurity, the energy level is preferably in the range of 5 kev to 15 kev. To the contrary, if BF$_2$ is used, the energy is preferably 10–25 kev. As stated earlier, with the optional removal of the nitride liner from the bitline side, the formation of the boron halo is more effective.

In a preferred embodiment, the resist 51 is stripped prior to the halo implant. In this case the stack height is favorable for forming halos 60 by using angled ion implantation, as shown in FIGS. 6A–6C. An implant angle of greater than 30° with respect to the normal to the surface is possible, since the removal of the resist 51 results in a relatively short stack height 301. The nitride barrier 50 does not block the implant from reaching the bitline contact diffusion region 306, since it had been previously removed. This allows the P-type halo impurity to be implanted beyond the edge of the source/drain diffusion regions of the NFET support devices 55 and the bitline contact diffusion regions 306. The angled implantation of the P-type impurity facilitates the formation of the halo.

Normally practiced anneals (such as BPSG reflow anneal) should be adequate to controllably drive the P-type impurity (e.g., boron) ahead of the N+ impurity (e.g., arsenic), to widen the halo. Since boron diffusion is greatly enhanced by the presence of interstitials, and is a much faster diffuser than arsenic, the boron will be driven ahead of the arsenic. An optional furnace anneal may also be used if more boron diffusion is needed. An rapid thermal anneal (RTA) is then used to annihilate excess interstitials and "freeze" the halo profile 60 as shown in FIGS. 6A and 6B.

As shown in FIGS. 7A–7C, a new resist 70 is formed and patterned to cover the active area and the N-type support field effect transistors 55 and to expose the P-type support field effect transistors 56. As discussed above, an etching process, such as reactive ion etching, is used to form the nitride sidewall spacers 73 along the sidewalls of the P-type support devices 56. Then, a P-type impurity 71, is implanted to dope the source/drain regions 72 of the P-type support field effect transistors 56.

The photoresist 70 is then removed and, as shown in FIGS. 8A and 8B an insulator glass such as BPSG 80 is deposited, reflowed, planarized and patterned. Then a TEOS layer (not shown) is deposited. The pattern in the insulator 80 includes openings for contacts to the diffusion regions in the active area 306, 308 and in the support devices 83.

The openings in the insulator 80 are filled with a conductive material (such as tungsten) to form the bitline contact 81 and the source and drain contacts 82 of the support devices. A key feature of the invention is that the same material (e.g., tungsten) can be utilized for the bitline contact 80 as well as the support source/drain contacts 82. This eliminates the need for separate deposition and planarization processes that are required if different materials are used for the bitline contacts 81 and the support source/drain contacts 82. This also allows borderless diffusion contacts in the support device. As mentioned above, because of the high concentration of N+ implant into the bitline contact, the tungsten bitline contacts 81 can be utilized with the inventive structure, thereby simplifying the manufacturing process of such integrated circuit devices.

Figure 9:
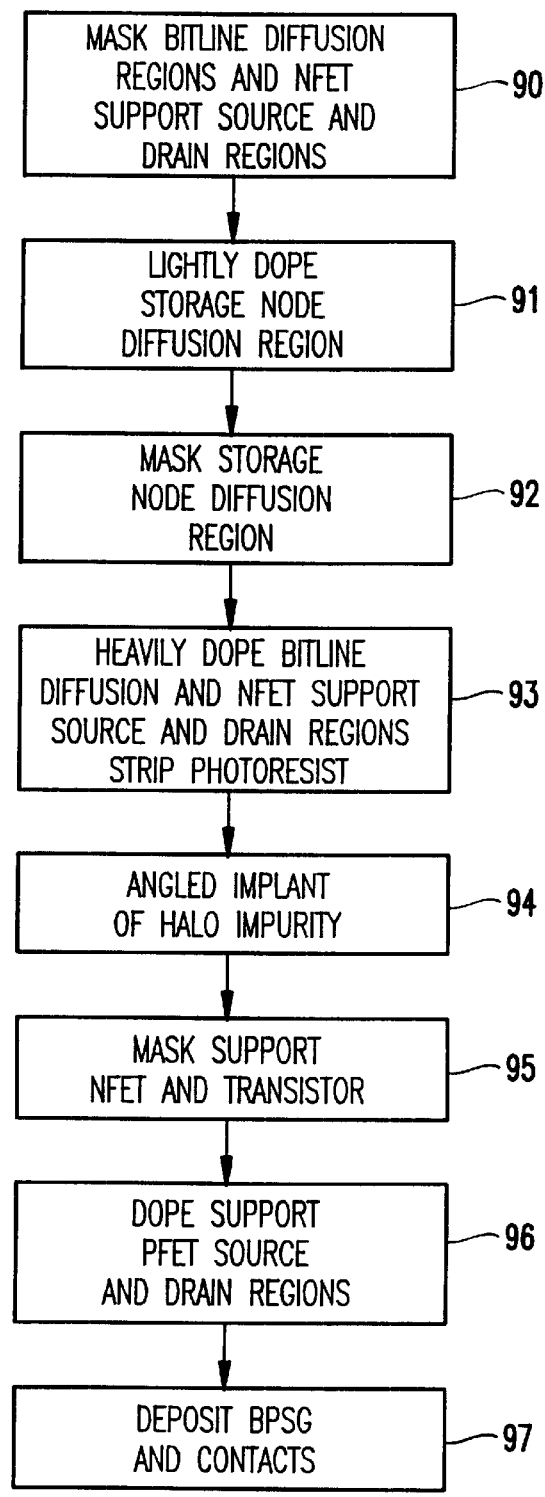
FIG. 9 is a flow diagram illustrating a preferred method of the invention.

A flowchart representation of the invention is shown in FIG. 9. More specifically, item 90 shows the masking of the bitline contact regions 306 and the support devices 55. In item 91, the storage node diffusion region 308 is lightly doped. In item 92, the storage node diffusion region 308 is masked and, in item 93 a more heavy doping is applied to the bitline contact diffusion region 306 and the N-type support devices 55. In item 94, the halo 60 is formed in the bitline contacts diffusion region 306 and the N-type support devices 55. The transistor 301 and the N-type support devices 55 are masked and the P-type support devices receive their source and drain implants, as shown in the items 95 and 96. Finally, in item 97, the insulator BPSG layer 80 and the contacts 81, 82 are formed.

Thus, the invention forms a P-type halo 60 which surrounds the N+ bitline diffusion region 306. Since the threshold voltage and short-channel effects of the array MOSFET are dominated by the halo, the normally implanted channel doping concentration may be greatly reduced, which allows the invention to achieve improved array threshold voltage (VT) control without increased node diffusion leakage. Furthermore, the invention allows the use of tungsten studs, which are normally only used in the supports, to be used in the array as well. In addition the invention also allows the support NFET source-drain extension diffusions (grading of lateral profile) to be made at same time as storage node diffusion. This improves hot-electron immunity.

While the invention has been described in terms of preferred embodiments, those skilled in the art will recognize that the invention can be practiced with modification within the spirit and scope of the appended claims.

What is claimed is:

1. A method for manufacturing an integrated circuit device, said method comprising:
   providing a substrate including a deep trench capacitor and a patterned gate stack;
   implanting a first type impurity to form a first diffusion region on a first side of said patterned gate stack and a second diffusion region on a second side of said patterned gate stack;
   forming a patterned insulator over said patterned gate stack, said patterned insulator exposing said second diffusion region; and
   implanting a second type impurity to form an angled halo implant in said second diffusion region.

2. The method in claim 1, wherein said implanting a first type impurity comprises:
   patterning a first mask to expose a first substrate region on said first side of said patterned gate stack;
   implanting a first species of said first type impurity into said first substrate region to form said first diffusion region using a first doping concentration;
   removing said first mask;
   patterning a second mask to expose a second substrate region on said second side of said patterned gate stack;
   implanting a second species of said first type impurity into said second substrate region to form said second diffusion region using a second doping concentration; and
   removing said second mask.

3. The method in claim 2, wherein said second doping concentration is higher than said first doping concentration.

4. The method in claim 3, wherein said second doping concentration is approximately 10 times said first doping concentration.

5. The method in claim 1, wherein said implanting a second type impurity to form said angled halo implant comprises an angled ion implantation and a geometry of said patterned gate stack, said patterned insulator and said second diffusion region allows ions applied at an angle up to approximately 30° to the normal of a surface of said second diffusion region to reach said second diffusion region.

6. The method in claim 1, further comprising, after said forming of said patterned insulator, introducing an amount of a first type impurity in said second diffusion region.

7. The method in claim 6, wherein said patterned gate stack, said first diffusion region and said second diffusion region are formed in an array area comprising dynamic random access memory cells.

8. The method in claim 7, further comprising forming support devices in a support area,
   wherein said introducing an amount of a first type impurity further includes introducing said first type impurity into source and drain regions of said support devices.

9. The method in claim 8,
   wherein said implanting a second type impurity to form a halo implant includes implanting selected ones of said support devices with said second type impurity.

10. The method in claim 9, further comprising:
    forming a patterned insulator over said patterned gate stack and said support devices, said patterned insulator including bitline contact openings, support source openings and support drain openings; and
    simultaneously depositing a conductor into said bitline contact openings, said support source openings and said support drain openings.

11. The method in claim 10, wherein said conductor comprises tungsten.

12. The method in claim 1, wherein said patterned insulator is free from blocking said second type impurity from said second diffusion region.

13. The method in claim 1, further comprising annealing said integrated circuit device to drive said second type impurity ahead of said first type impurity.

14. The method in claim 13, wherein said annealing comprises a furnace anneal.

15. The method in claim 13, wherein said annealing comprises a rapid thermal anneal to freeze said angled halo implant.

16. The method in claim 1, wherein said patterned gate stack, said first diffusion region and said second diffusion region are formed in an array area comprising dynamic random access memory cells.

17. The method in claim 16, further comprising forming support devices in a support area,
    wherein said implanting a first type impurity includes implanting a species of said first type impurity into source and drain regions of said support devices.

18. The method in claim 16, further comprising forming support devices in a support area,
    wherein said implanting a second type impurity to form said halo implant includes implanting selected ones of said support devices with said second type impurity.

19. The method in claim 18, further comprising:
    forming a second patterned insulator over said patterned gate stack and said support devices, said second patterned insulator including bitline contact openings, support source openings and support drain openings; and
    simultaneously depositing a conductor into said bitline contact openings, said support source openings and said support drain openings.

20. The method in claim 19, wherein said conductor comprises tungsten.

21. A method for manufacturing an integrated circuit device, said method comprising:
    providing a substrate including a deep trench capacitor and a patterned gate stack having a first side and a second side;
    patterning a first mask to expose a first substrate region on said first side of said patterned gate stack;
    implanting a first species of a first type impurity into said first substrate region to form said first diffusion region using a first doping concentration;
    removing said first mask;
    patterning a second mask to expose a second substrate region on said second side of said patterned gate stack;
    implanting a second species of said first type impurity having a first conductivity into said second substrate region to form said second diffusion region using a second doping concentration, wherein said second doping concentration is higher than said first doping concentration;
    removing said second mask; and
    implanting a second type impurity to form a halo implant into said second diffusion region.

22. The method in claim 21, wherein said implanting a second type impurity to form a halo implant comprises:
    forming an insulator over said patterned gate stack; and
    removing a portion of said insulator from said second diffusion region to form a sidewall spacer along a portion of said patterned gate stack adjacent said second diffusion region, wherein said implanting a second type impurity comprises an angled ion implantation into said second diffusion region, wherein said insulator is free from blocking said angled ion implantation from said second diffusion region.

23. The method in claim 21, wherein said second doping concentration is approximately 10 times said first doping concentration.

24. The method in claim 21, wherein said implanting a second type impurity comprises an angled ion implantation and a geometry of said patterned gate stack, said insulator and said second diffusion region allows ions applied at an angle up to approximately 30° to the normal of a surface of said second diffusion region to reach said second diffusion region.

25. The method in claim 21, wherein said patterned gate stack, said first diffusion region and said second diffusion region are formed in an array area comprising dynamic random access memory cells.

26. The method in claim 25, further comprising forming support devices in a support area, wherein said implanting a first species of a first type impurity includes implanting said first species into source and drain regions of selected ones of said support devices.

27. The method in claim 25, further comprising forming support devices in a support area, wherein said implanting a second species of a first type impurity includes implanting said second species into source and drain regions of selected ones of said support devices.

28. The method in claim 27, further comprising:

forming a patterned insulator over said patterned gate stack and said support devices, said patterned insulator including bitline contact openings, support source openings and support drain openings; and simultaneously depositing a conductor into said bitline contact openings, said support source openings and said support drain openings.

29. The method in claim 21, further comprising annealing said integrated circuit device to drive said second type impurity ahead of said first type impurity.

* * * * *